United States Patent [19]

Morishita

[11] Patent Number: 5,602,413
[45] Date of Patent: Feb. 11, 1997

[54] AVALANCHE PHOTOTRANSISTOR

[75] Inventor: Masakazu Morishita, Atsugi, Japan

[73] Assignee: Canon Kabushiki Kaisha, Tokyo, Japan

[21] Appl. No.: 57,455

[22] Filed: May 7, 1993

Related U.S. Application Data

[63] Continuation of Ser. No. 627,303, Dec. 14, 1990, abandoned.

[30] Foreign Application Priority Data

Dec. 15, 1989 [JP] Japan .................................. 1-324987

[51] Int. Cl.$^6$ ................................................ H01L 31/11
[52] U.S. Cl. ........................ 257/438; 257/462; 257/465; 257/589
[58] Field of Search ................. 357/30 A, 30 P, 357/13, 34; 257/462, 589, 438, 463, 464, 465

[56] References Cited

U.S. PATENT DOCUMENTS

| | | |
|---|---|---|
| 3,714,526 | 1/1973 | Low et al. .............................. 357/30 P |
| 3,886,579 | 5/1975 | Ohuchi et al. ......................... 357/30 A |

FOREIGN PATENT DOCUMENTS

| | | | |
|---|---|---|---|
| 9442 | 4/1980 | European Pat. Off. ................. | 357/92 |
| 3436927 | 4/1986 | Germany ............................. | 357/30 P |

OTHER PUBLICATIONS

Campbell et al, IEEE Trans. on Electron Devices, vol. ED30 No. 4 Apr. 1983, pp. 408–411.

A. Chin, et al., "A Controlled–Avalanche Superlattice Transistor", *IEEE Proceedings/Cornell Conference on Advanced Concepts in Highspeed Semiconductor Devices and Circuits*, pp. 255–264, Aug. 1987.

C. Y. Chen, et al., "GaAs/Al$_x$Ga$_{1-x}$ As Depletion Stop Phototransistor Grown By Molecular Beam Epitaxy", *Applied Physics Letters*, pp. 510–512, Mar. 15, 1982.

*Primary Examiner*—William D. Larkins
*Attorney, Agent, or Firm*—Fitzpatrick, Cella, Harper & Scinto

[57] ABSTRACT

A bipolar avalanche phototransistor has a thin, heavily doped base portion adjacent the collector to improve avalanche characteristics. The structure may have a lateral, as well as vertical, collector, with the thin heavily doped base portion adjoining the surface lateral collector.

6 Claims, 7 Drawing Sheets

AVALANCHE PHOTOTRANSISTOR

This application is a continuation of application Ser. No. 07/627,303 filed Dec. 14, 1990, now abandoned.

BACKGROUND OF THE INVENTION

1. Field of the Invention

The present invention relates to a photoelectric converting device.

2. Related Background Art

In the conventional art of the photoelectric converting devices, there is for example known a device of a bipolar transistor type.

Figure 9:
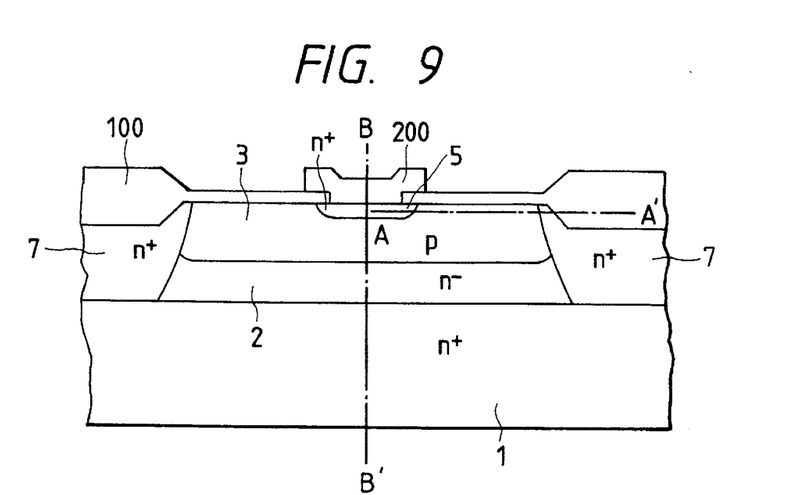
FIG. 9 is a schematic cross-sectional view of an example of the conventional bipolar photoelectric converting device.

FIG. 9 shows, in a schematic cross-sectional view, an example of the conventional bipolar photoelectric converting device, in which there are provided a silicon substrate 1 of n⁻ or n⁺-type by doping of an impurity such as phosphor (P), antimony (Sb) or arsenic (As); an n⁻-area 2 formed for example by an epitaxial process; a p-area 3 for accumulating photogenerated carriers; an n⁺-area 5 constituting an emitter for obtaining an output signal; an n⁺-area 7 constituting a channel stop or connected with the collector; an insulating film 100 for isolating the element; and an electrode 200 composed for example of polysilicon or metal.

In such a photoelectric converting device, various developmental efforts have been made to achieve a finer geometry and a higher level of integration, in order to respond to the requirement for compactization of the solid-state image sensor or the like employing such photoelectric converting device.

However, such conventional photoelectric converting device, if made with a finer geometry, results in a reduced amount of photogenerated charge due to the diminished aperture rate, leading to a lowered photosensitivity.

In the conventional bipolar photoelectric converting device, the photosensitivity is represented, in approximate manner, by the following equation:

$$Se = \frac{i_p \cdot A_s \cdot t_s}{C_{bc}} \quad (1)$$

wherein $i_p$ is the photoinduced current density per unit area; $A_s$ is the area of aperture; $t_s$ is the accumulation time, and $C_{bc}$ is the base-collector capacitance.

As will be apparent from the equation (1), the sensitivity $Se$ decreases with the reduction of the aperture area $A_s$.

SUMMARY OF THE INVENTION

In consideration of the foregoing, an object of the present invention is to provide a photoelectric converting device with an improved sensitivity Se in the above-explained equation (1).

Another object of the present invention is to provide a photoelectric converting device provided at least with a first semiconductor area of a first conductivity type, a second semiconductor area of a second conductivity type, and a third semiconductor area of the first conductivity type. The charge generated by the light irradiating said second semiconductor area is taken out from said first semiconductor area, comprising:

a fourth semiconductor area of the second conductivity type, formed in contact with said second semiconductor area and having a higher impurity concentration than in said second semiconductor area; and a fifth semiconductor area of the first conductivity type, formed in contact with said fourth semiconductor area and having an impurity concentration approximately equal to that in said fourth semiconductor area. The electron ionization coefficient α, electron velocity v and width W of depletion layer in said fourth and fifth semiconductor areas satisfy a relation $\alpha_n \cdot v_n \cdot W > 1$ or $\alpha_p \cdot v_p \cdot W > 1$.

Still another object of the present invention is to provide a photoelectric converting device provided at least with a first semiconductor area of a first conductivity type, a second semiconductor area of a second conductive type, and a third semiconductor area of the first conductivity type. The charge generated by the light irradiating said second semiconductor area is taken out from said first semiconductor area, further comprising:

a sixth semiconductor area of the second conductivity type, formed between said second and third semiconductor areas and having a higher impurity concentration than in said second semiconductor area. The electron ionization coefficient α, electron velocity v and width W of depletion layer in said sixth semiconductor area satisfy a relation $\alpha_n \cdot v_n \cdot W > 1$ or $\alpha_p \cdot v_p \cdot W > 1$.

Still another object of the present invention is to provide a photoelectric converting device as mentioned above, further comprising:

a seventh semiconductor area of the second conductivity type, formed between said first and second semiconductor areas and having a higher impurity concentration than in said second semiconductor area. The electron ionization coefficient α, electron velocity $v_n$ and width W of depletion layer in said seventh semiconductor area satisfy a relation $\alpha_n \cdot v_n \cdot W > 1$.

DETAILED DESCRIPTION OF THE PREFERRED EMBODIMENTS

The photoelectric converting device of the present invention can increase the amount of generated charge, by amplifying the photoexcited current by electron-hole collision ionization between the base and collector of the sensor cell, thereby improving the photosensitivity.

Said collision ionization will be explained in the following.

The electron-hole pair formation rate G by collision ionization in a strong electric field in a semiconductor is given by:

$$G = \alpha_n \cdot n \cdot v_n + \alpha_p \cdot p \cdot v_p \quad (cm^{-3} \cdot sec^{-1}) \quad (2)$$

wherein $\alpha_n$ is the electron ionization rate ($cm^{-1}$), ap is the positive hole ionization rate ($cm^{-1}$), n is the electron density ($cm^{-3}$), p is the positive hole density ($cm^{-3}$), $v_n$ is the electron velocity (cm/sec), and $v_p$ is the positive hole velocity (cm/sec).

Figure 7:
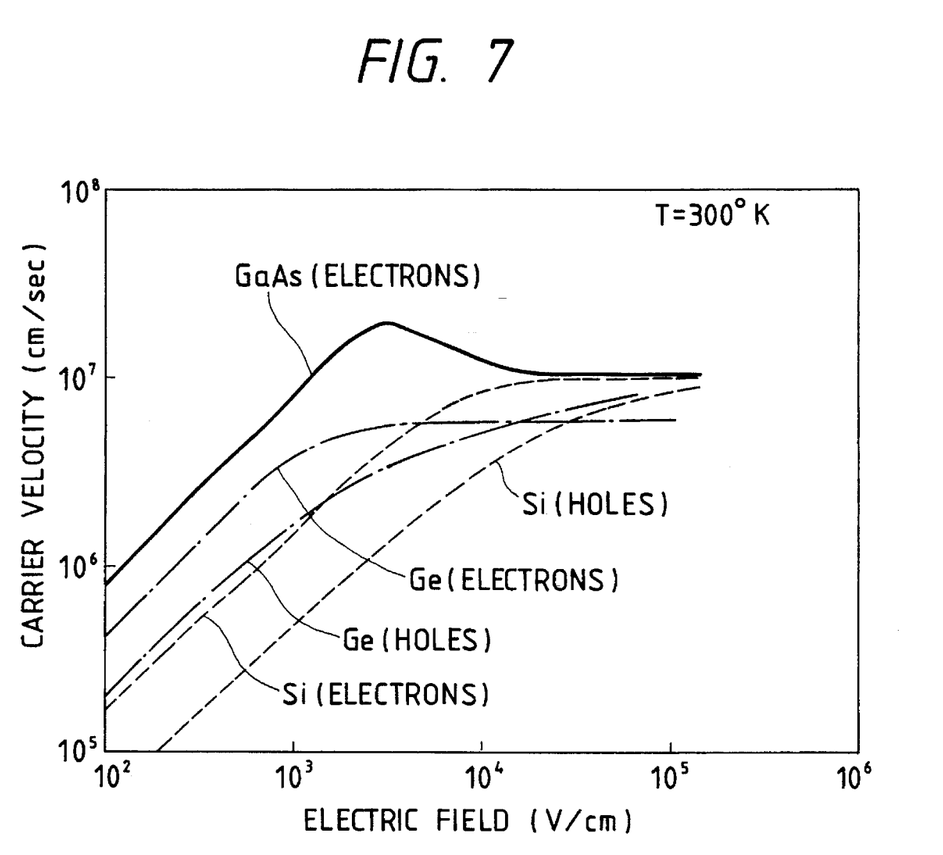
FIG. 7 is a chart showing the relation between electric field (V/cm) and carrier velocity $v_n$, $v_p$ (cm/sec)

FIG. 7 shows the relation between the electric field (V/cm) and the carrier velocity $v_n$, $v_p$ (cm/sec).

Figure 8:
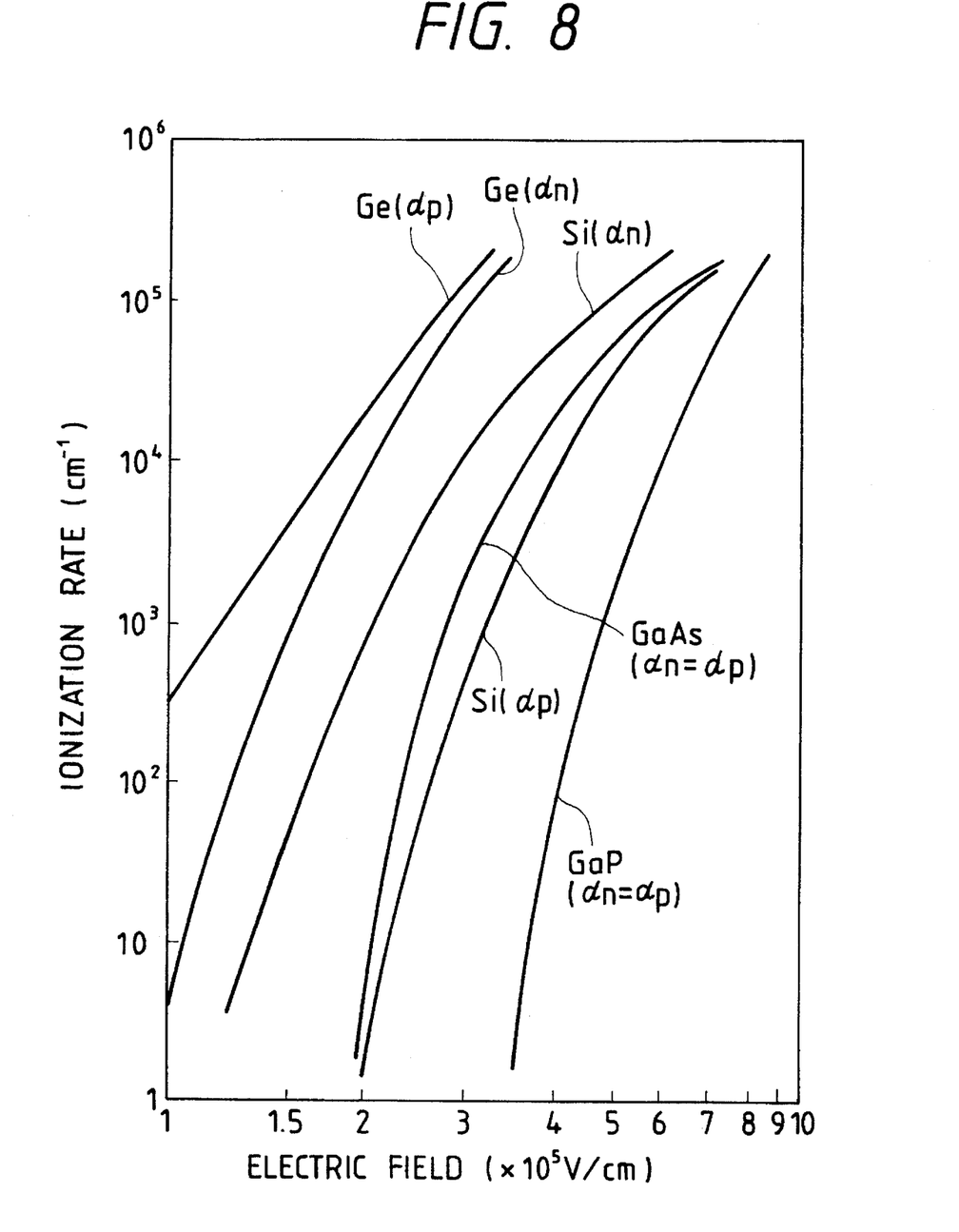
FIG. 8 is a chart showing the relation between electric field (V/cm) and ionization rate $\alpha_n$, $\alpha_p$ (cm⁻¹)

Also FIG. 8 shows the relation between the electric field (V/cm) and the ionization rate $\alpha_n$, $\alpha_p$ ($cm^{-1}$).

From FIGS. 7 and 8, the values of $\alpha_n$, $\alpha_p$, $v_n$ and $v_p$ can be determined for a given electric field, so that G can be easily determined.

For example for an electric field $E=3\times10^5$ V/cm (in case of a pn junction), there is obtained $\alpha_n v_n = 10^{11}$ sec$^{-1}$, so that the amplification rate by collision ionization is $10^6$ times per second with a depletion layer of 0.1 μm at the pn junction per unit area.

[1st embodiment]

In the following there will be explained an embodiment of the present invention, with reference to the attached drawings.

Figure 1A:
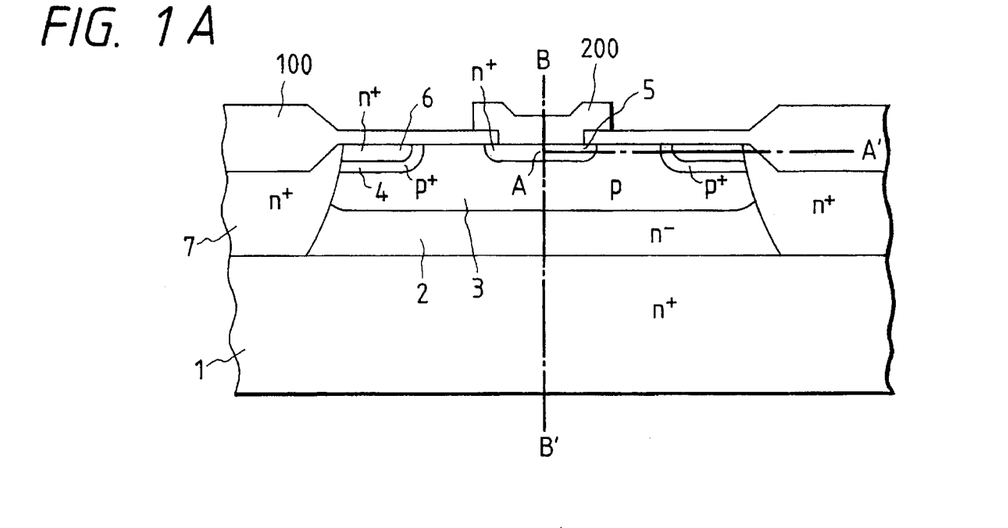
FIG. 1A is a schematic cross-sectional view of an example of the photoelectric converting device embodying the present invention.

FIG. 1A is a schematic cross-sectional view of the photoelectric converting device of the present embodiment, wherein the same components as those in FIG. 9 are represented by the same numbers. There are also shown a $p^+$-area 4 in the base 3, and an $n^+$-area 6 for forming a steep potential slope.

Figure 1B:
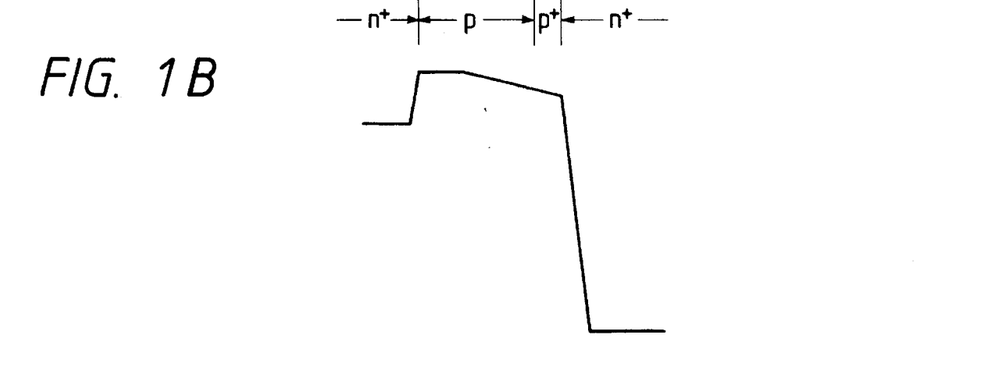
FIG. 1B is a potential chart along a line A—A' in FIG. 1A.

FIG. 1B is a potential chart along a cross section A—A' in FIG. 1A, showing the potential in the ordinate as a function of the distance in the abscissa.

Figure 1C:
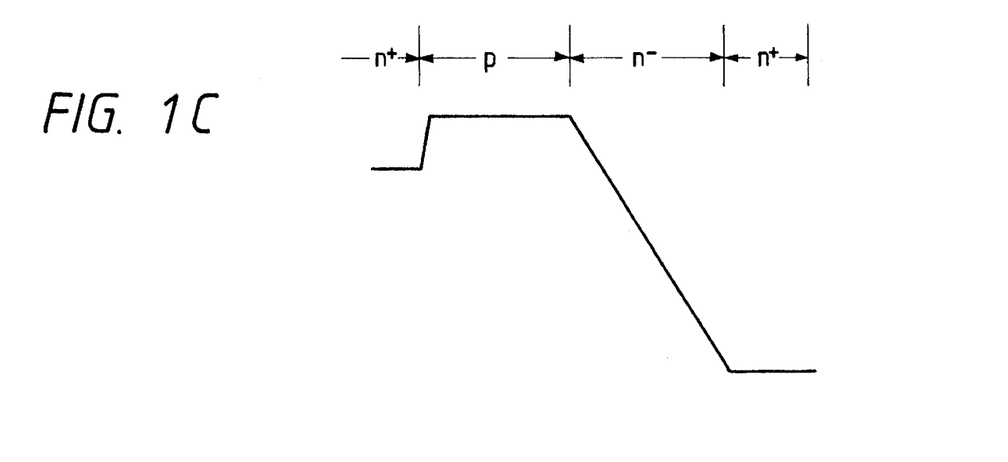
FIG. 1C is a potential chart along a line B—B' in FIG. 1A.

FIG. 1C is a potential chart along a cross section B—B' in FIG. 1A, showing the potential in the ordinate as a function of the distance in the abscissa, as in FIG. 1B.

The feature of the present invention lies in an abrupt potential difference in a $p^+n^+$ junction shown in FIG. 1B, giving rise to the amplification of the generated carriers. The potential shown in FIG. 1C is not different from that in the conventional bipolar transistor.

In the following a more detailed explanation will be given on FIG. 1B.

In the sensor cell of the present embodiment, an abrupt potential difference between a $p^+$-area and an $n^+$-area by the presence of an $n^+/p/p^+/n^+$ structure mentioned above, and the depletion layer is extended to the p-area by forming the thinner $p^+$-area. Among the electron-hole pairs generated by light absorption in the semiconductor, a major portion of the electrons in the $p/p^+$-areas and in the depletion layer at the $p^+/n^+$ junction moves to the $n^+$-area 5 by diffusion or drift, thereby contributing to the amplification of photoinduced carriers. On the other hand, among the positive holes, those generated in the depletion layer at the $p^+/n^+$ junction contribute to the amplification of the carriers. Two-dimensionally, the carriers which do not flow into the depletion layer of the $n^+$-area 6 do not contribute to the amplification.

Figure 2A:
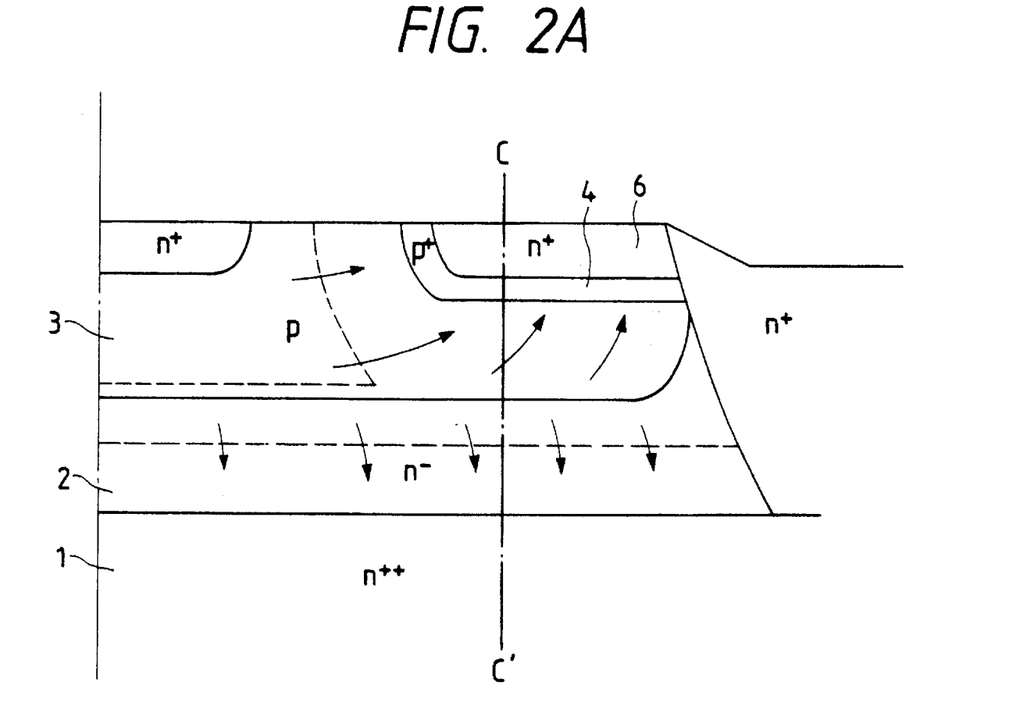
FIG. 2A is a partial magnified cross-sectional view of the device shown in FIG. 1A.

FIG. 2A is a partial magnified cross-sectional view of FIG. 1A, wherein broken lines indicate extent of the depletion layers. At the pn$^-$ junction between the p-area 3 and the $n^-$-area 2, the depletion layer stretches itself in said $n^-$-area 2, since the impurity concentration of the p-area 3 is made higher to satisfy a condition $N_p \gg N_n$. On the other hand, at the junction of the $n^+$-area 6, $p^+$-area 4 and p-area 3, the impurity concentration is about the same in said $n^+$-area 6 and $p^+$-area 4 and is lower in the p-area 3, but the depletion layer extends to the area 3 because the $p^+$-area 4 is formed thin.

Figure 2B:
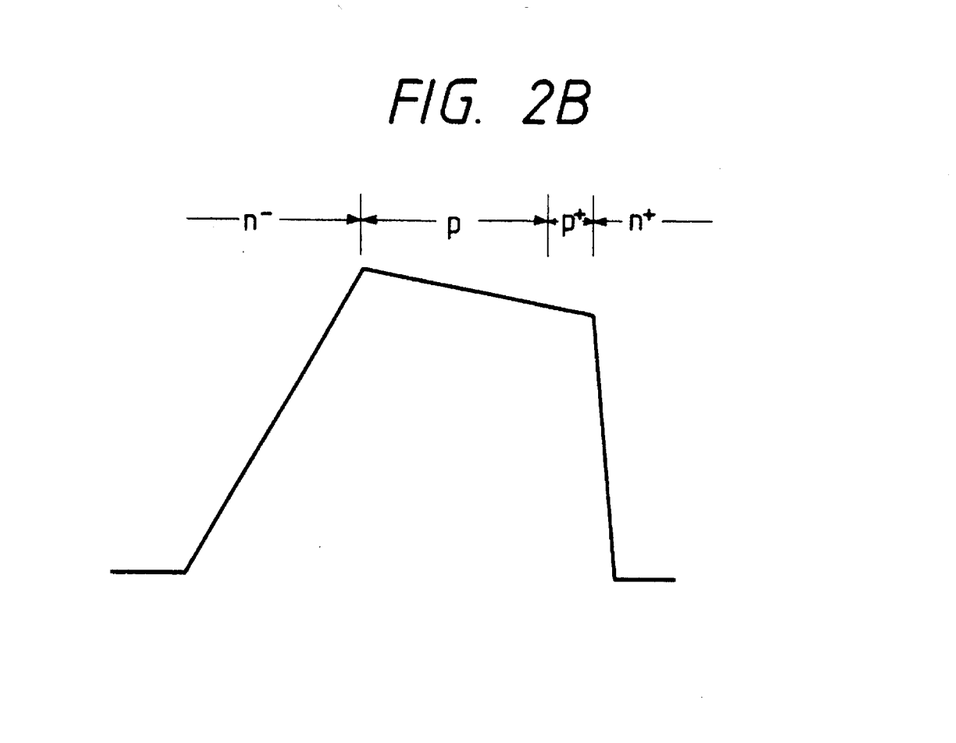
FIG. 2B is a potential chart along a line C—C' in FIG. 2A.

Consequently the potential distribution along a cross section C—C' in FIG. 2A, approximately assumes a form shown in FIG. 2B, whereby the electrons generated in the p-area 3 can be collected in the $n^+$-area 6 as indicated by arrows in FIG. 2A, and an effective carrier amplification can be achieved.

Besides the base-collector capacitance is reduced drastically by the mutual connection, as shown in FIG. 2A, of the depletion layer extending from the area 6 and that extending from the area 2. This corresponds to a drastic decrease of $C_{bc}$ in the equation (1), so that the sensitivity is further improved.

The depletion layer width of a semiconductor pn junction is represented by the following equation:

$$W = \left\{ \frac{2\epsilon_s}{q} \cdot \frac{N_A + N_D}{N_A \cdot N_D} \cdot (V_{bi} + V_R) \right\}^{1/2} \quad (3)$$

wherein $\epsilon_s$ is the dielectric constant of the semiconductor, q is the charge, $N_A$ is the concentration of p-impurity, $N_D$ is the concentration of n-impurity, $V_{bi}$ is the built-in voltage, and $V_R$ is the reverse applied voltage. In the equation (3), $V_{bi}+V_R$ indicates the total potential V.

Figure 3:
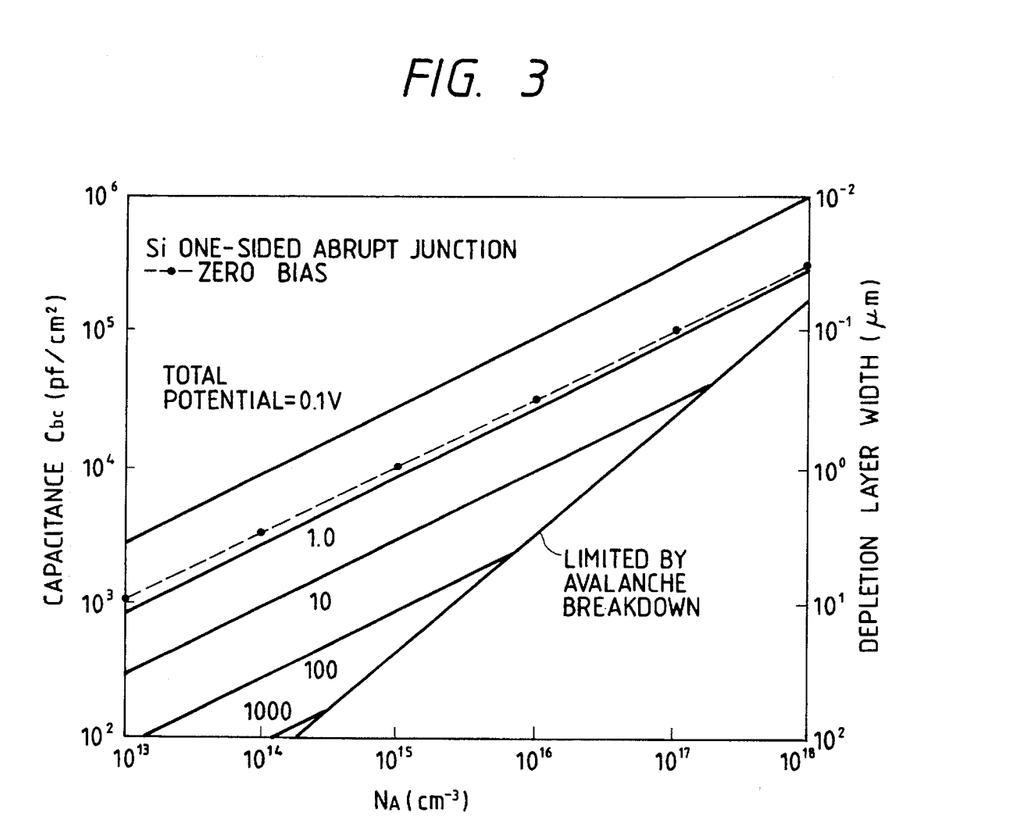
FIG. 3 is a graph showing a relation between $N_A$ and the depletion region width and capacity in the case of $N_D \gg N_A$.

FIG. 3 is a chart showing the relation between $N_A$ and depletion layer width or capacitance in case of $N_D \gg N_A$, with the total potential V taken as a parameter. FIG. 3 also shows the limit of avalanche.

Figure 4:
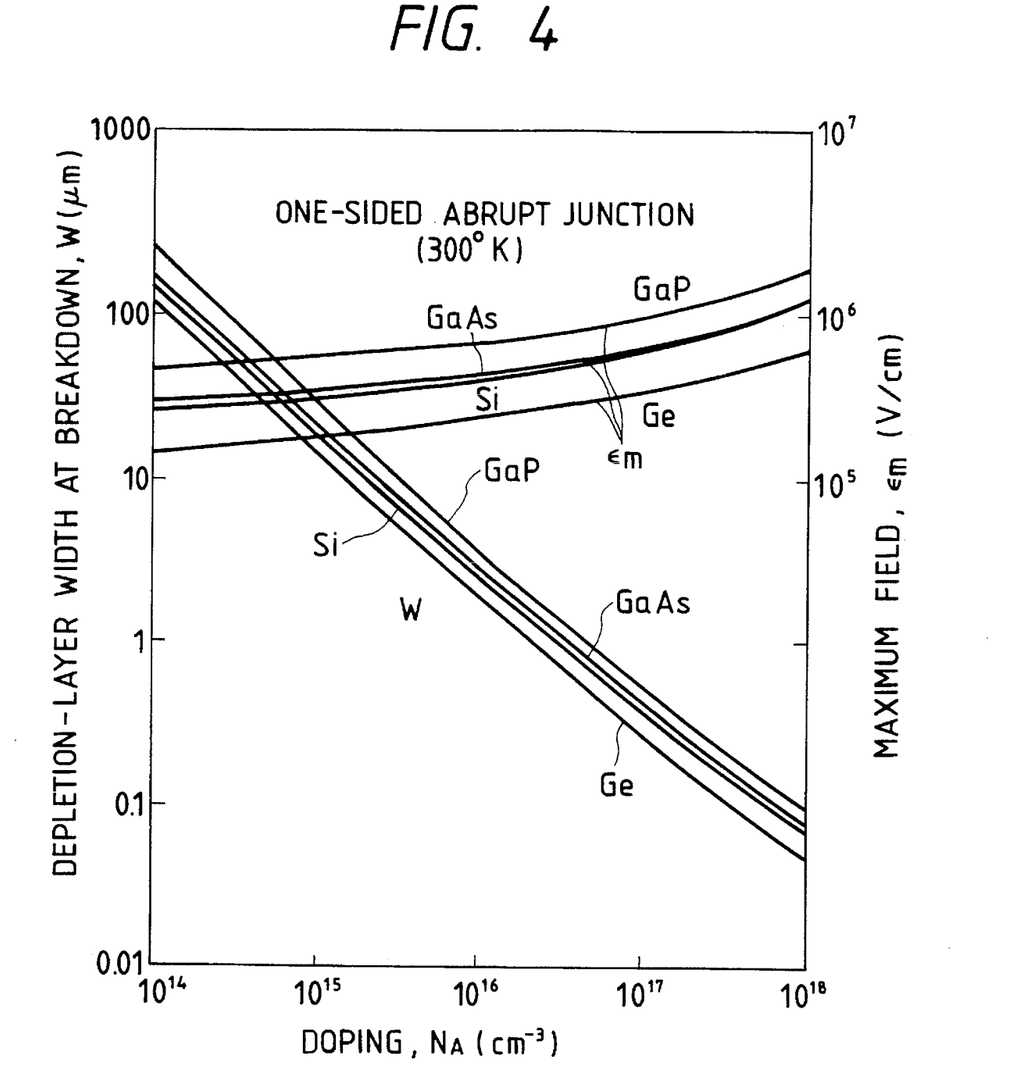
FIG. 4 is a chart showing the relation between maximum depletion layer width at avalanche breakdown or maximum field and $N_A$ in case of $N_D \gg N_A$.

FIG. 4 is a chart showing the relation between $N_A$ and maximum depletion layer width at avalanche breakdown or maximum field in a similar case of $N_D \gg N_A$. Such limit condition is undesirable because of increases of noises, though the photosignal is also amplified.

The device of the present invention, effecting carrier amplification under a strong electric field, is preferably used in a voltage range lower than the voltage of avalanche breakdown. For example, in case of silicon, there is obtained $\epsilon_m = 6\times10^5$ V/cm for $N_A = 10^{17}$ cm$^{-3}$ from FIG. 4, and the device is preferably used below the above-mentioned potential. The width of the depletion layer is about 0.4 μm.

In the present embodiment, as the $p^+$-area 4 and the $n^+$-area 6 have approximately same impurity concentrations, the maximum width of the depletion layer is $\sqrt{2}$ times of that shown in FIG. 4.

In the following there will be explained the amplification by collision ionization in the present embodiment.

The ionization rate in a strong electric field in a semiconductor is represented by the following equation:

$$\alpha = A \cdot exp[-b/\epsilon] \quad (4)$$

If the semiconductor is silicon, there are given $A_n = 3.8 \times 10^{16}$ cm$^{-1}$ and $b_n = 1.75 \times 10^6$ V/cm for electrons, and $A_p = 2.25 \times 10^7$ cm$^{-1}$ and $b_p = 3.26 \times 10^6$ V/cm (300° K) for positive holes. $\epsilon$ indicates the electric field (V/cm).

Though the electric field in a pn junction has a certain distribution, the average electric field E is related with the maximum electric field $E_{max}$ by:

$$E_{max} = 2E \quad (5)$$

Consequently the carrier amplification factor at the pn junction can be determined by selecting E in such a manner that the $E_{max}$ at the pn junction does not exceed $E_{max}$ shown in FIG. 4, and making an approximation that the carriers are accelerated with an average electric field E with a depletion layer width W. More specifically, W is determined by selecting $N_A = N_D$ in the equation (3) (approximated as $|p^+| = |n^+|$ in the present embodiment). Then, under a condition $E = (V_{bi} + V_R)/W$, $\alpha$ and $v_n$ are respectively determined from the equation (4) and FIG. 7. Thus the carrier amplification factor ($\alpha_n \cdot v_n \cdot W$) for electrons per unit area of pn junction can be determined.

Table 1 shows examples of calculation of the current amplification factor. As shown in this table, no amplification is obtained for a low impurity concentration and a low voltage (in case of $\alpha_n \cdot v_n \cdot W \leq 1$). Consequently a higher impurity concentration is desirable, though it is limited the breakdown voltage of the pn junction. On the other hand, noises increases in case of a high impurity concentration and a high voltage as explained before. Consequently limitation appears in a part of the impurity concentration of base and collector, and in the collector potential.

The photocurrent obtained by amplification can be represented as follows:

$$i_p = q \cdot G \cdot W \quad (6)$$
$$= q(n \cdot a_n \cdot v_n + p \cdot a_p \cdot v_p) W (A/cm^2)$$

The photoelectric converting device of the present embodiment was prepared in the following manner:

(1) On the $n^+$-substrate 1, the $n^-$-area 2 was formed by epitaxial growth.

(2) The isolation area 100 and the $n^+$-area 7 were formed for example by selective oxidation.

(3) The p-area 3 constituting the photosensitive area (base) was formed by ion implantation, thermal diffusion etc.

(4) After opening of the emitter contact, the polysilicon layer 200 was deposited, doped with an impurity and patterned.

The $n^+$-area 5 was formed by simultaneous thermal diffusion.

(5) After photoresist patterning, boron and arsenic were implanted in the same areas and were heat treated to form the $n^+$-area 6 and the $p^+$-area 4.

The $p^+$-area 4 can be made deeper than the $n^+$-area 6 either by the difference in diffusion speed of the impurities, or by the difference in penetration depth of the impurities in ion implantation.

The photoelectric converting device thus prepared exhibited excellent photosensitivity in the functional test.

[2nd embodiment]

Figure 5:
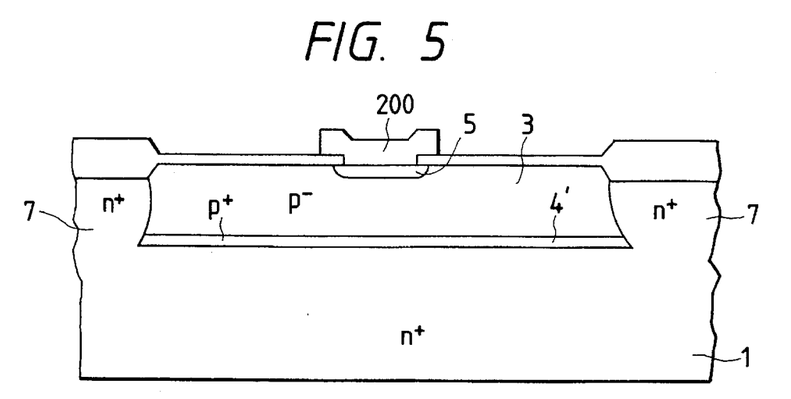
FIG. 5 is a schematic cross-sectional view of a photoelectric converting device constituting a second embodiment of the present invention.

FIG. 5 is a schematic cross-sectional view of the photoelectric converting device constituting a second embodiment of the present invention.

The device of the present embodiment is different from the conventional photoelectric converting device in the presence of a $p^+$-area 4' under the base area 3. Such $n^+/p^-/p^+/n$ structure also provided the effect of the present invention.

[3rd embodiment]

Figure 6:
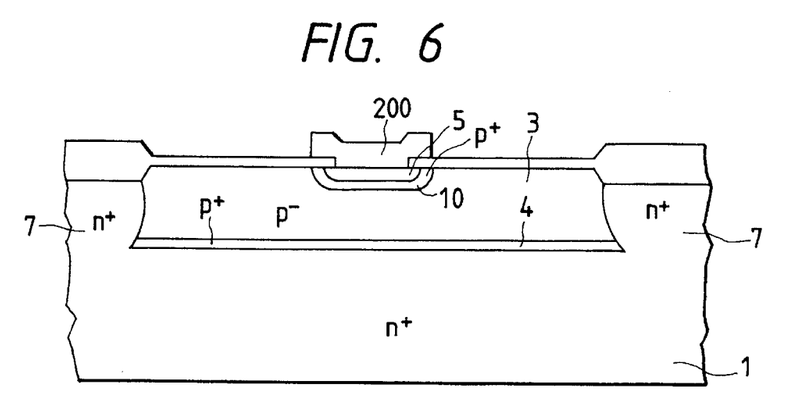
FIG. 6 is a schematic cross-sectional view of a photoelectric converting device constituting a third embodiment of the present invention.

FIG. 6 is a schematic cross-sectional view of the photoelectric converting device constituting a third embodiment of the present invention.

The device of the present embodiment is provided, in addition to the device of the foregoing 2nd embodiment, with a $p^+$-area 10 under the emitter 5.

In the photoelectric converting device of the present embodiment, the depletion layer of the $p^+$-area 3 can be stopped by the $p^+$-area 10. In this case the $p^-$-area 3 can be composed of an i-layer with an extremely low impurity concentration. Thus the device of the present embodiment has an $n^+/p^+/p^-/p^+/n$ structure or an $n^+/p^+/i/p^+/n$ structure.

An excellent photosensitivity could also be obtained in such photoelectric converting device.

Though an npn bipolar transistor is employed in the present embodiment, a photoelectric converting device of similar high sensitivity can also be obtained by employing a pnp bipolar transistor in the sensor cell.

A high photosensitivity can be obtained with the pnp bipolar transistor, if the depletion layer between the base and the collector satisfy a condition $\alpha_p \cdot v_p \cdot W > 1$.

TABLE 1

| Impurity concentration $N_A = N_D$ (cm$^{-3}$) | Total potential ($V_{bi} + V_R$) | | | |
|---|---|---|---|---|
| | 5 V | 10 V | 20 V | 40 V |
| $1 \times 10^{15}$ | — | — | — | $2 \times 10^{-9}$ |
| $3 \times 10^{15}$ | — | — | $2.7 \times 10^{-6}$ | 1.6 |
| $1 \times 10^{16}$ | — | $3.4 \times 10^{-3}$ | $1.9 \times 10^1$ | $9.1 \times 10^3$ |
| $3 \times 10^{16}$ | $2.5 \times 10^{-1}$ | $2.8 \times 10^2$ | $4.6 \times 10^4$ | $2 \times 10^6$ |
| $1 \times 10^{17}$ | $4.6 \times 10^3$ | $2.7 \times 10^5$ | $5.2 \times 10^6$ | — |
| $3 \times 10^{17}$ | $5.6 \times 10^6$ | $6.6 \times 10^6$ | — | — |
| $1 \times 10^{18}$ | $8.12 \times 10^6$ | $3.67 \times 10^7$ | — | — |

As detailedly explained in the foregoing, the present invention enables amplification of the carriers generated by incident light, thereby significantly improving the photosensitivity of the photoelectric converting device.

The present invention is particularly effective when the photoelectric converting device is miniaturized, photosensitivity equal to or larger than that in the conventional device can be obtained even if the aperture rate is reduced.

What is claimed is:

1. A photoelectric conversion device comprising:

an emitter region of a first conductivity type;

a base region of a second conductivity type opposite to the first conductivity type, said base region having (1) a first base section arranged adjacent to and below said emitter region, and (2) a second base section of an impurity concentration higher than that of said first base section, said second base section arranged adjacent to an upper portion of said first base section and above a lower portion of said first base section, separated from said emitter region by said upper portion of said first base section; and a collector region of the first conductivity type, having (1) a first collector section, an impurity concentration of which is lower than that of said first base section, arranged substantially below said first base section, (2) a second collector section, an impurity concentration of which is higher than that of said first base and collector sections, arranged adjacent to an upper portion of said second base section and above a lower portion of said second base section to form a junction with said second base section, and separated from said first base section by said upper portion of said second base section, and (3) a third collector section, an impurity concentration of which is also higher than that of said first base and collector sections, arranged adjacent to said second collector section, said second base section, said first base section and said first collector section, in that order wherein said second base section is made sufficiently thin so that when a voltage of less than an avalanche breakdown voltage is applied across the junction between said second base section and said second collector section a depletion layer extends from that junction into said first base section.

2. A device according to claim 1, wherein the first conductivity type is n-type.

3. A device according to claim 1, wherein the second conductivity is p-type.

4. A photoelectric conversion device comprising:

an emitter region of a first conductivity type;

a base region of a second conductivity type opposite to the first conductivity type arranged adjacent to and below said emitter region;

a collector region of the first conductivity type arranged substantially below said base region and separated from said base region by a thin layer region of the second conductivity type arranged between said base region and said collector region to form a junction with said collector region, said thin layer region having an impurity concentration higher than that of said base region, and being made sufficiently thin so that when a voltage of less than an avalanche breakdown voltage is applied across the junction between said thin layer region and said collector region, a depletion layer extends from that junction into said base region; and an additional layer of the second conductivity type and of an impurity concentration higher than that of said base region, said additional layer being arranged between said emitter region and said base region.

5. A device according to claim 4, wherein the first conductivity type is n-type.

6. A device according to claim 4, wherein the second conductivity type is p-type.

* * * * *